(12) United States Patent
Perkins et al.

(10) Patent No.: US 6,490,173 B2
(45) Date of Patent: Dec. 3, 2002

(54) METHOD AND APPARATUS FOR PROVIDING ELECTROMAGNETIC SHIELDING

(75) Inventors: Russell Wayne Perkins, Carmel, IN (US); Mark Alan Yoder, Carmel, IN (US); Christopher Day States, Plainfield, IN (US); Theodore Paul Corbin, Indianapolis, IN (US)

(73) Assignee: Thomson Licensing, S.A., Boulogne-Billancourt (FR)

( * ) Notice: Subject to any disclaimer, the term of this patent is extended or adjusted under 35 U.S.C. 154(b) by 0 days.

(21) Appl. No.: 09/740,115

(22) Filed: Dec. 19, 2000

(65) Prior Publication Data

US 2002/0075664 A1 Jun. 20, 2002

(51) Int. Cl.[7] ................................................. H05K 9/00
(52) U.S. Cl. ....................... 361/816; 361/818; 361/800; 361/704; 174/51; 174/35 R
(58) Field of Search ............................. 361/816, 814, 361/800, 818, 682, 683, 694, 701, 702, 703, 743, 720, 717, 718, 712, 719, 721; 174/51, 35 R; 228/21, 22, 180.1, 179.1, 180.21, 248.1, 254, 256

(56) References Cited

U.S. PATENT DOCUMENTS

| | | | |
|---|---|---|---|
| 4,370,515 A | * | 1/1983 | Donaldson ................ 174/35 R |
| 4,717,990 A | | 1/1988 | Tugcu |
| 4,861,941 A | * | 8/1989 | Kubo et al. ............... 174/35 R |
| 4,948,923 A | * | 8/1990 | Suzuki ..................... 174/35 R |
| 5,241,453 A | | 8/1993 | Bright et al. |
| 5,357,404 A | | 10/1994 | Bright et al. |
| 5,477,916 A | | 12/1995 | Lin |
| 5,566,052 A | | 10/1996 | Hughes |
| 5,583,377 A | | 12/1996 | Higgins, III |
| 5,748,449 A | * | 5/1998 | Tahmassebpur ............. 361/753 |
| 5,844,784 A | | 12/1998 | Moran et al. |
| 5,880,930 A | | 3/1999 | Wheaton |
| 6,021,046 A | | 2/2000 | McLellan et al. |
| 6,034,874 A | | 3/2000 | Watanabe |
| 6,049,469 A | | 4/2000 | Hood, III et al. |
| 6,088,231 A | | 7/2000 | Fajardo |
| 6,097,612 A | * | 8/2000 | Ishikawa et al. ............ 361/794 |

* cited by examiner

*Primary Examiner*—Randy W. Gibson
*Assistant Examiner*—Hung Bui
(74) *Attorney, Agent, or Firm*—Joseph S. Tripoli; Robert D. Shedd

(57) ABSTRACT

An apparatus and method for shielding electrical components mounted on a printed circuit board (PCB) from electromagnetic and radio frequency interference by reducing the dissipation of heat away from solder joints. In an embodiment of the invention a radio frequency (RF) shield for a printed circuit board comprises a shield for RF shielding a portion of the PCB having electronic components mounted thereon. The shield has a first portion and a second portion, wherein the first portion has a reduced cross sectional area, for reducing heat conduction between the first and the second portion when the first portion of the shield is inserted into a first plurality of holes in the PCB, for soldering the first portion of the shield to a copper foil of the PCB.

12 Claims, 3 Drawing Sheets

METHOD AND APPARATUS FOR PROVIDING ELECTROMAGNETIC SHIELDING

FIELD OF THE INVENTION

The invention relates to electronic assembly packaging in general, and, more particularly, the invention relates to a method and apparatus for shielding electrical components mounted on a printed circuit board from electromagnetic and radio frequency interference.

BACKGROUND OF THE DISCLOSURE

The current trend in the electronics industry is to miniaturize components and circuits and to place as many of the components and circuits next to each other as possible to provide quality technical performance in a small package. Any device that conveys electrical signals, such as a wire, a printed circuit board (PCB), an integrated circuit (IC) and the like radiates and is (typically) susceptible to electromagnetic interference (EMI) and/or radio frequency interference (RFI). Electromagnetic interference and radio frequency interference effect devices by corrupting or altering the electrical signal that the device conveys. Such corruption of an electrical signal in a device is usually not tolerable. Thus, it is critical that these devices be shielded from each other and other electromagnetic and radio frequency interferences.

In devices such as digital satellite receivers, EMI and RFI shields are made of tinplate sheet metal and are wave soldered directly onto the PCB. It is critical that a continuous solder joint is made between the shield and the ground plane of the PCB, which acts as a shield on the bottom of the circuit board. Because of their relatively large size, the shields have a high thermal capacitance. When the combination of the shield and PCB are processed through a wave solder machine, a large amount of the heat is conducted into the shield and away from the solder joint being formed. As a result, the area to be soldered may not reach optimal temperature for proper soldering. This results in cold solder joints or solder voids wherein gaps are created in the shield's performance.

One prior art method to overcome the problem is to use pre-heaters inside the wave solder machine to heat the PCB combination before the PCB combination passes through the wave solder machine. However, the correct balance of heat is difficult to control and maintain using this technique.

A second prior art method to overcome the problem is to use multi-layer PCBs having plated slots for insertion of shield tabs. Unfortunately, having plated slots require two additional steps in the PCB manufacturing process and adds considerable cost to the resulting product.

SUMMARY OF THE INVENTION

The disadvantages associated with the prior art are overcome by an apparatus and method for shielding electrical components mounted on a printed circuit board (PCB) from electromagnetic and radio frequency interference by reducing the dissipation of heat away from the solder joints.

In an embodiment of the invention, a radio frequency (RF) shield for a printed circuit board comprises a shield for RF shielding a portion of the PCB having electronic components mounted thereon. The shield has a first portion and a second portion, wherein the first portion has a reduced cross sectional area, for reducing heat conduction between the first and the second portion when the first portion of the shield is inserted into a first plurality of apertures in the PCB, for soldering the first portion of the shield to a copper foil of the PCB.

In alternative embodiments of the invention, a plurality of apertures are disposed on the first portion of the RF shield for further reducing the heat conducted between the first and second portion. The holes are arranged linearly within the thickness of the PCB perpendicular portion.

Further embodiments of the present invention will become apparent from the detailed description contained hereinafter. It should be understood, however, that the detailed description and specific examples are given by way of illustration only, since various changes and modifications within the spirit and scope of the invention will become apparent to those skilled in the art from this detailed description.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
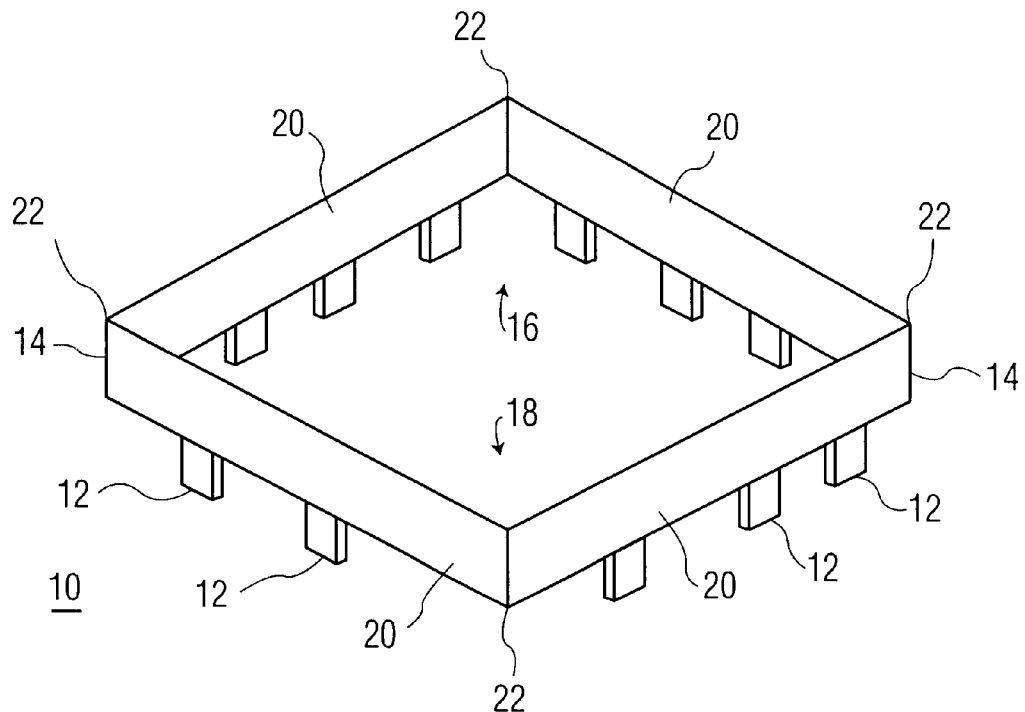
FIG. 1 illustrates a radio frequency (RF) shield according to an embodiment of the present invention.

FIG. 1 illustrates a radio frequency (RF) shield 10 according to an embodiment of the present invention. Specifically, the heatsink 10 comprises a rectangular first portion 12, a rectangular second portion 14, an open top 16 and an opposing open bottom 18. It will be appreciated by those skilled in the art that first portion 12 and second portion 14 may also be formed using non-rectangular shapes. Moreover, it will be appreciated that while the RF shield 10 of FIG. 1 is described primarily in rectangular and other specific shapes, various modifications to such shapes are contemplated by the inventor and within the scope of the present invention.

More specifically, second portion 14 comprises side walls 20 structured and arranged to generally form a square. The side walls 20 are joined at corners 22 by spot welding or the like. In another embodiment of the invention, second portion 14 can be preformed as a one piece design.

Figure 2:
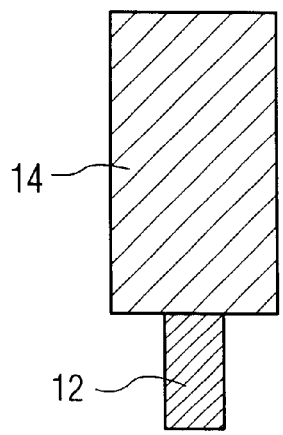
FIG. 2 depicts the first portion of the RF shield of FIG. 1.

First portion 12 extends downwardly from second portion 14 and can be, for example, solder tabs. Compared to second portion 14, first portion 12 has a reduced cross sectional area (See FIG. 2) for reducing the amount of heat conduction between first portion 12 and second portion 14. The reduced cross sectional area is effected for example by fabricating first portion 12 out of a thinner material than second portion 14. Thus, the thermal mass of RF shield 10 is reduced.

The principle that a reduced cross sectional area will result in a reduction in heat conduction between first portion 12 and second portion 14 can be understood by examining equation (1) as follows:

$$q_x = kA\, dt/dx \qquad \text{equation (1)}$$

$q_x = kA\, dT/dx$ is an equation for heat transfer conduction where:

"k" is the coefficient of thermal conductivity for a certain material

"A" is the cross sectional area of the material or portion of the material perpendicular to the path of heat flow, and "dT/dx" is the change in temperature along a path. In order to decrease $q_x$ either k, A or dT/dx must be decreased. However, if k is decreased by changing to a less conductive material, then RF shield 10 will receive less heat energy from a solder wave machine resulting in cold solders. Cold solders have cracks and can allow RF interference to affect electronic components mounted on a printed circuit board (PCB) 24. Altering dT/dx is constrained by the design requirements of the RF shield 10 and by the parameters of the solder wave machine.

A preferred thickness range for first portion 12 is about 16–21 mm for an RF shield 10 made of steel. The limitations placed on the thickness of first portion 12 are based on the structural integrity of the material comprising RF shield 10. For instance, the thickness of first portion 12 will vary for the different materials making up RF shield 10. Experimentation has shown that the cross sectional area of first portion 12 can be reduced by 50% or more and still give structural strength. These thicknesses may be readily varied based on the need for more or less structural strength.

Although the RF shield 10 of FIG. 1 is made of steel, it is understood by those skilled in the art that RF shield 10 can be made of any thermally conductive material (e.g. tin plated zinc, aluminum, tin platted copper, copper). The preferred embodiment uses tin plated steel.

Figure 3:
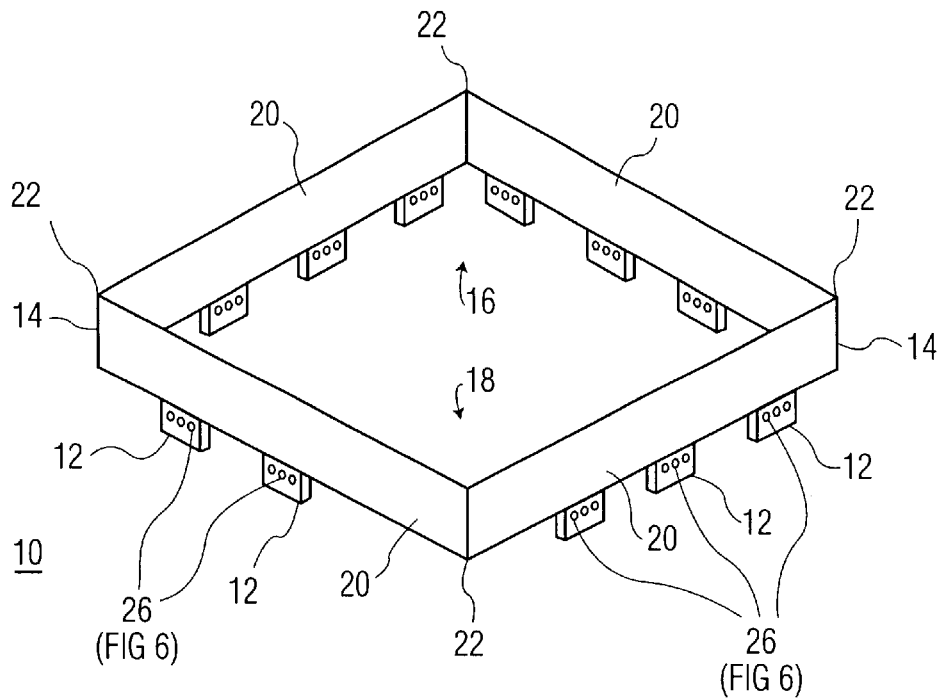
FIG. 3 depicts an RF shield having a plurality of apertures.
Figure 6:
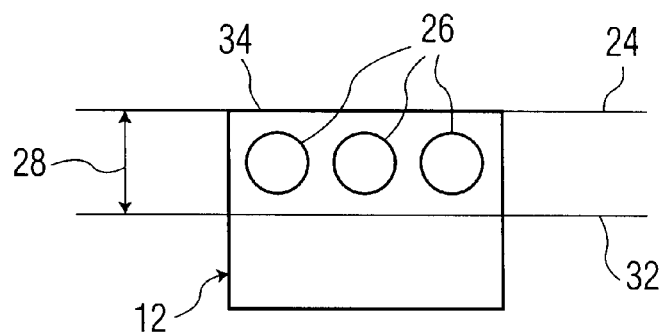
FIG. 6 depicts a cut out view of a first portion of the RF shield within a thickness of the PCB.

FIG. 3 depicts an RF shield having a plurality of apertures. Specifically, first portion 12 has a plurality of apertures 26 disposed thereon. The apertures in portion 14 are arranged in a linear fashion. In the preferred embodiment, each of the apertures is about 0.045"×0.090". The apertures act as a choke for the thermal conduction and keep the heat of the wave solder in first portion 12 allowing for a good solder joint. Additionally, having apertures in first portion 12 serves to further reduce the material content of first portion 12. The placement of the apertures on first portion 12 is important. The second plurality of apertures 26 must be structured and arranged so that the apertures align within a thickness 28 of the PCB 24 (FIG. 6). The apertures must be low enough so that the solder fills the apertures completely. If the apertures fall below the thickness 28 of the PCB 24, a majority of heat energy from the wave solder machine will bypass first portion 12, rendering the choke useless.

Although the plurality of apertures 26 are depicted as circular holes, it will be appreciated by those skilled in the art that other types of apertures such as slits and the like may be used.

Figure 4:
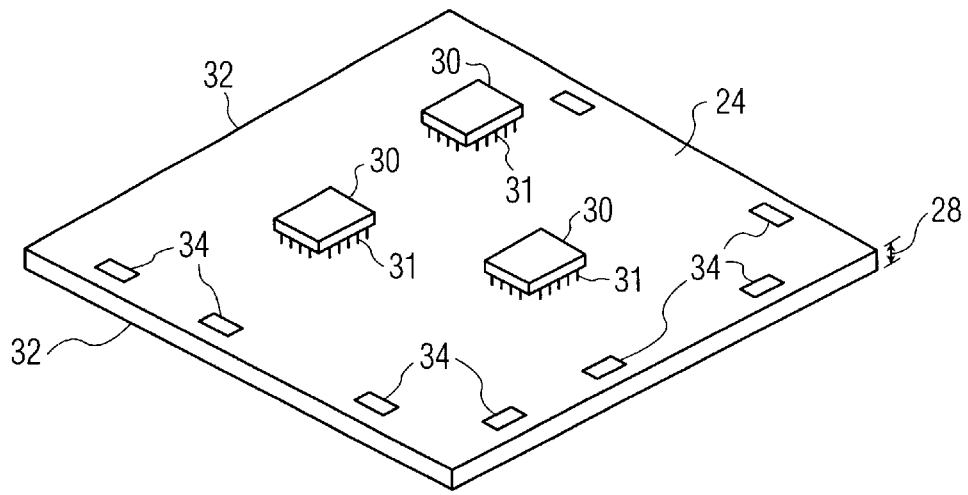
FIG. 4 depicts an isometric view of electronic components mounted to a printed circuit board (PCB)

FIG. 4 depicts an isometric view of electronic components 30 mounted to the printed circuit board (PCB) 24. Electronic components 30 comprise, for example, an integrated circuit, digital tuner, RF modulator and the like. Leads 31 are coupled to the electronic components 30 and extend outward for attachment to PCB 24. On a bottom surface 32 of PCB 24, a copper foil (not shown) is attached to the PCB 24. A plurality of apertures 34 are disposed on PCB 24 and adapted to accept portion 12. The PCB 24 is a conventional PCB and has a thickness of about 0.060".

Figure 5:
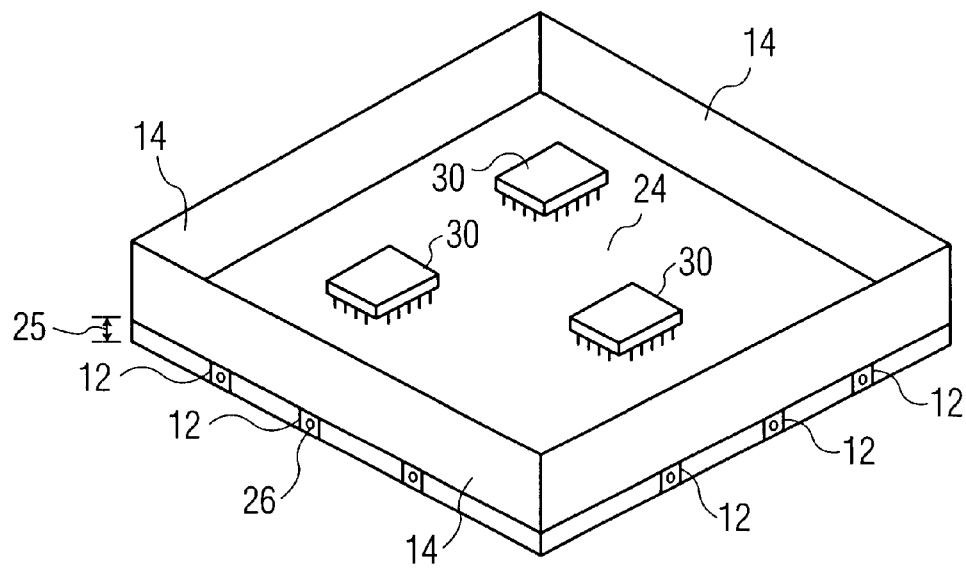
FIG. 5 depicts an assembly including RF shield according to an embodiment of the present invention.

FIG. 5 depicts an assembly including an RF shield according to an embodiment of the present invention. Specifically, FIG. 5 depicts an isometric view of a structure comprising a RF shield 10 formed according to the present invention soldered to the PCB 24 and shielding electronic components 30 mounted on the PCB 24. More specifically, the first portion 12 of RF shield 10 has been inserted into a first plurality of apertures 34 in PCB. Solder is added to fill first plurality of apertures 34. Since first portion 12 has a reduced cross sectional area, heat is concentrated within first portion 12 ensuring maximum heat transfer to the solder joints. The second plurality of apertures 26 disposed on first portion 12 is aligned within the thickness 28 of PCB 24. The solder fills second plurality of apertures 26 completely.

In another embodiment of the invention the RF shield assembly can be preheated before and/or during the period the assembly passes through the wave solder machine.

Thus, as described, the present invention provides for enhanced electromagnetic and radio frequency shielding of conventional electronic components 30 by making a continuous solder joint between the RF shield 10 and PCB 24. By utilizing an arrangement whereby the present invention having a reduced cross sectional area is soldered to the PCB, minimal heat is dissipated away from the solder joints resulting in good solder bonds among the solder tabs, PCB 24 and solder. This is accomplished without requiring the design of customized components.

Although various embodiments which incorporate the teachings of the present invention have been shown and described in detail herein, those skilled in the art can readily devise many other varied embodiments that still incorporate these teachings.

What is claimed is:

1. A printed circuit board (PCB) construction comprising:
    a PCB having electronic components mounted thereon which are susceptible to picking up electromagnetic interference signals;
    a shield material for radio frequency (rf) shielding a portion of the PCB, the shield having a first portion and a second portion, the first portion of the shield being inserted into an aperture in the PCB, the first portion being soldered to a copper foil of the PCB, and structural means for reducing the amount of heat conduction between the first portion and the second portion of the shield; and
    wherein the structural means for reducing the amount of heat conduction between the first portion and the second portion of the shield comprises apertures in the shield material for narrowing the path for heat conduction from the first portion and the second portion of the shield.

2. The printed circuit board construction of claim 1 wherein said apertures of said shield material are disposed on said first portion of said shield.

3. The printed circuit board construction of claim 2 wherein said apertures disposed on said first portion of said shield are aligned within a thickness of said PCB.

4. The printed circuit board construction of claim 1 wherein said first portion of said shield comprises shield tabs.

5. The printed circuit board construction of claim 1 wherein the structural means for reducing the amount of heat conduction between the first portion and the second portion of the shield comprises a reduction in the cross-sectional area of the shield material.

6. The printed circuit board construction of claim 5 wherein said first portion of said shield has a reduced cross-sectional area.

7. The printed circuit board construction of claim 6 wherein said cross sectional reduction is effected using a thinner first portion than second portion.

8. The printed circuit board construction of claim 1, wherein said first portion and said second portion have a same thickness.

9. An apparatus for dissipating maximum heat to solder joints said apparatus comprising:

a shield for radio frequency (RF) shielding a portion of a printed circuit board (PCB) having electronic components mounted thereon, the shield having a first portion and a second portion, wherein said first portion has a reduced cross sectional area for reducing heat conduction between said first and said second portion when the first portion of the shield is inserted into a first plurality of holes in said PCB for soldering the first portion of the shield to a copper foil of the PCB; and wherein said cross sectional reduction is effected using a thinner first portion than said second portion.

10. The apparatus of claim 9 wherein said first portion comprises shield tabs.

11. The apparatus of claim 9 wherein said first portion comprises a plurality of apertures disposed on said first portion for reducing the conduction of heat between said first portion and said second portion.

12. The apparatus of claim 11 wherein said second plurality of apertures are aligned within a thickness of said PCB.

* * * * *